United States Patent
Nakai (10) Patent No.: US 8,116,154 B2
(45) Date of Patent: Feb. 14, 2012

(54) SEMICONDUCTOR MEMORY DEVICE WITH A WRITE CONTROL CIRCUIT COMMONLY PROVIDED FOR A PLURALITY OF PAGES

(75) Inventor: Kiyoshi Nakai, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 198 days.

(21) Appl. No.: 12/691,293

(22) Filed: Jan. 21, 2010

(65) Prior Publication Data

US 2010/0182829 A1 Jul. 22, 2010

(30) Foreign Application Priority Data

Jan. 21, 2009 (JP) ................................. 2009-011305

(51) Int. Cl.
*G11C 7/22* (2006.01)
(52) U.S. Cl. .............. 365/189.16; 365/230.03; 365/163; 365/148
(58) Field of Classification Search .................. 365/148, 365/163, 189.16, 189.04, 230.03, 230.06, 365/233.1
See application file for complete search history.

(56) References Cited

U.S. PATENT DOCUMENTS

| | | | |
|---|---|---|---|
| 6,654,290 B2 * | 11/2003 | Lee et al. | 365/185.23 |
| 7,154,788 B2 | 12/2006 | Takemura et al. | |
| 7,304,885 B2 | 12/2007 | Cho et al. | |
| 7,463,511 B2 * | 12/2008 | Choi et al. | 365/163 |
| 7,471,590 B2 | 12/2008 | Davis et al. | |
| 8,014,194 B2 * | 9/2011 | Sheu et al. | 365/163 |
| 2009/0052233 A1 | 2/2009 | Nakai | |

FOREIGN PATENT DOCUMENTS

| | | |
|---|---|---|
| JP | 2005-158199 | 6/2005 |
| JP | 2006-024355 | 1/2006 |

* cited by examiner

*Primary Examiner* — Andrew Q Tran
(74) *Attorney, Agent, or Firm* — Morrison & Foerster LLP (57) ABSTRACT

To provide a plurality of write amplifiers that perform a data write operation upon memory cells and a write control circuit that controls a timing of a data write operation performed by the write amplifiers. When a data write operation using another write amplifier is requested while a data write operation using a predetermined write amplifier is performed, the write control circuit suspends the data write operation using the predetermined write amplifier. The suspended data write operation is performed again simultaneously with the data write operation using the other write amplifier. Accordingly, random column access like that of a DRAM can be realized by simple control.

12 Claims, 9 Drawing Sheets

SEMICONDUCTOR MEMORY DEVICE WITH A WRITE CONTROL CIRCUIT COMMONLY PROVIDED FOR A PLURALITY OF PAGES

BACKGROUND OF THE INVENTION

1. Field of the Invention

The present invention relates to a semiconductor memory device, and more particularly to a semiconductor memory device having memory cells with a relatively long time required for data write.

2. Description of Related Art

PRAMs (Phase change Random Access Memories) that perform data storing by using a phase change material have been proposed as a type of semiconductor memories that is an alternative to DRAMs (see Japanese Patent Application Laid-open Nos. 2006-24355 and 2005-158199). A PRAM stores data depending on a phase state of the phase change material included in a recording layer. Because an electric resistance of the phase change material in a crystalline phase is different greatly from that in an amorphous phase, data can be recorded utilizing such a difference.

The phase state is changed by applying a write current to the phase change material to heat it. Data is read by applying a read current to the phase change material to measure its resistance value. The read current is set to be far lower than the write current so that the phase is not changed. Because the phase state of the phase change material is not changed unless high temperature heat is applied, the data is not lost even when a power supply is turned off.

To amorphize (reset) a phase change material, the phase change material needs to be heated to a temperature equal to a melting point or higher by applying the write current and then cooled rapidly. To crystallize (set) the phase change material, the phase change material needs to be heated to a temperature higher than a crystallization temperature and lower than the melting point by applying the write current and then cooled gradually. Accordingly, a time required for a set operation is longer than that required for a reset operation in a PRAM.

As described above, because the time required for a set operation is different greatly from the time required for a reset operation in a PRAM, control utilizing a set pulse for performing the set operation and a reset pulse for performing the reset operation is often performed to ensure compatibility with other general purpose memories such as a DRAM.

Meanwhile, in accessing to other general purpose memories such as a DRAM, addresses are generally inputted twice in a divided manner. That is, a row address is inputted first and then a column address is inputted. According to a DRAM, for example, after a row address is inputted, different column addresses are successively inputted, thereby writing data successively. To enable such successive data write in a PRAM, a write control circuit that generates a set pulse and a reset pulse (these pulses are collectively called "write signal") is provided for each page. The "page" represents a memory cell group the same column address is allocated to.

However, when the write control circuit is provided for each page, the circuit size is increased naturally. Particularly in a case of a semiconductor memory device with a long page length like a DRAM, the increased circuit size may lead to an increase in the chip area. Such a problem occurs not only in a PRAM but also in a semiconductor memory device including memory cells with a relatively long time required for data write.

SUMMARY

To solve the above problem, the present inventors have invented a method of allocating one write control circuit to a plurality of pages and filed Japanese Patent Application No. 2007-217967 on Aug. 24, 2007, based on which a U.S. patent application Ser. No. 12/196,393 was filed on Aug. 22, 2008 and published as US Patent Application Publication No. US 2009/0052233 A1. According to this method, a write operation is not performed immediately after a write request is issued. Instead, the write operation is performed after confirming that write requests for other pages sharing the same write control circuit are not provided. That is, the write operation is held temporarily and then performed actually.

With the above method, although one write control circuit is shared by a plurality of pages, column addresses are successively inputted after a row address is inputted, thereby writing data successively. That is, random column access as that in a DRAM can be realized.

However, according to the invention of Japanese Patent Application No. 2007-217967, each time when a write request is issued, a write operation needs to be held temporarily, and this results in rather complicated control. Accordingly, there has been a demand for a semiconductor memory device that can realize random column access in a write operation by simpler control while one write control circuit is allocated to a plurality of pages.

In one embodiment, there is provided a semiconductor memory device comprising: a plurality of memory cell arrays, each of which includes a plurality of memory cells and a write amplifier that performs a data write operation upon a selected memory cell among the memory cells during a period when a write signal is in an active state; and a write control circuit that supplies the write signal commonly to the memory cell arrays and includes a plurality of flags which are provided for the respective memory cell arrays, each flag being brought into a set state when an associated one of the memory cell arrays is performing the data write operation, wherein the write control circuit brings the write signal in an inactive state, and then brings the write signal in the active state again in response to a data write request for another memory cell array being issued while a data write operation is performed upon one of the memory cell arrays, thereby performing the data write operation upon the memory cell array corresponding to a flag in the set state along with the memory cell array to which the data write request is issued.

In another embodiment, there is provided a semiconductor memory device that includes: a plurality of memory cells; a plurality of write amplifiers that perform a data write operation upon a selected memory cell among the memory cells; and a write control circuit that controls a timing of a data write operation performed by the write amplifiers, wherein when successive data write operations using different write amplifiers are requested, the write control circuit, in response to a final data write request, causes the different write amplifiers to perform the data write operations simultaneously.

In still another embodiment, there is provided a comprising: a plurality of write control circuits each allocated to a plurality of pages, respectively; and a plurality of write amplifiers provided for each of the write control circuits and write data in corresponding memory cells, wherein each of the write control circuits supplies a write signal with a predetermined active sequence commonly to corresponding write amplifiers and flag signals to the write amplifiers allocated to different pages, each of the write amplifiers supplies a write current to memory cells during a period when the write signal and the flag signal are in an active state, and when a plurality of data write operations using a plurality of write amplifiers allocated to a same write control circuit but in different pages are requested successively, the write control circuit brings the corresponding flag signal in the active state and restarts the active sequence of the write signal each time when a data write operation is requested, and in response to completion of the active sequence of the write signal, the write control circuit brings all of the flag signals in an inactive state.

In the present invention, the data write operation is not suspended each time when the write request is issued. Instead, the data write operation is performed regardless of the existence of successive write requests, and thus control becomes easy. Further, when a write request using another write amplifier that shares the same write control circuit is issued, the data write operation for the previous write request is performed again. Accordingly, random column access as that in a DRAM can be realized.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF THE PREFERRED EMBODIMENTS

Preferred embodiments of the present invention will be explained below in detail with reference to the accompanying drawings.

Figure 1:
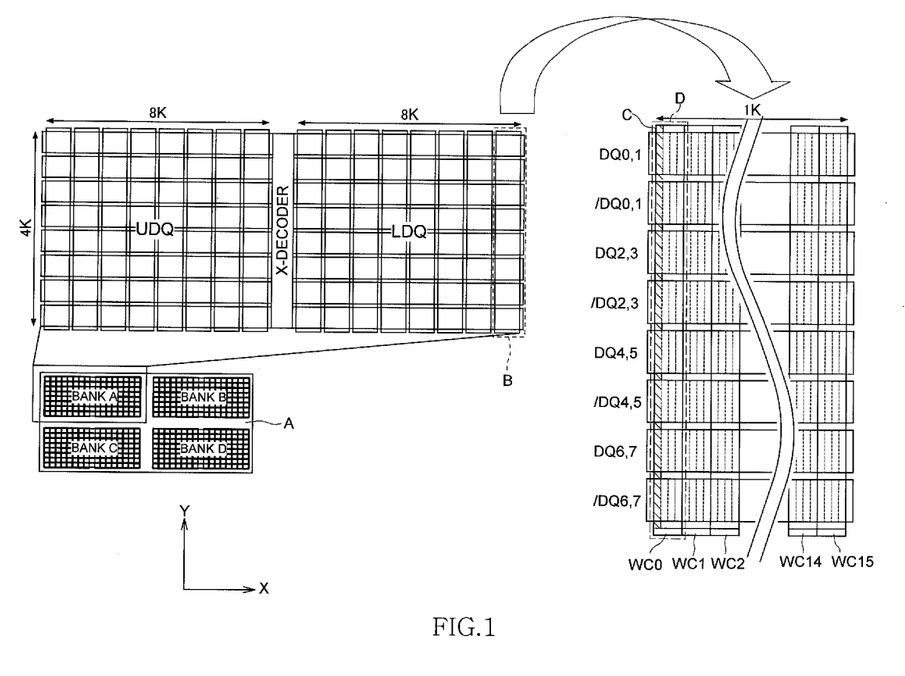
FIG. 1 is a schematic diagram for explaining an overall configuration of memory cells in a semiconductor memory device according to an embodiment of the present invention.

FIG. 1 is a schematic diagram for explaining an overall configuration of memory cells in a semiconductor memory device according to an embodiment of the present invention.

The semiconductor memory device according to the present embodiment is a PRAM that is compatible with an SDRAM (Synchronous DRAM) and has a configuration of, for example, 16 M-bits×16 I/Os (DQ0 to DQ15). That is, it is a 256 M-bits PRAM that 16 I/Os, each of which has a capacity of 16 M-bits are arranged in parallel. The phrase "compatible with an SDRAM" means that an external controller can handle this semiconductor memory device like an SDRAM.

Although not limited, the semiconductor memory device according to the present embodiment is divided into four banks (BANKS A to D). The bank is a unit capable of receiving commands independently. Each bank is divided into two memory regions LDQ and UDQ arranged in an X direction. An X decoder extending in a Y direction is arranged between these memory regions LDQ and UDQ. The X decoder is a circuit that selects word lines based on row addresses. In the memory region LDQ, memory cells corresponding to lower 8 bits of I/Os (DQ0 to DQ7) are arranged. In the memory region UDQ, memory cells corresponding to upper 8 bits of I/Os (DQ8 to DQ15) are arranged. In a region A between the banks, peripheral circuits such as a command decoder, an address decoder, an internal clock generating circuit, and a timing signal generating circuit and external terminals are arranged.

Each of the memory regions LDQ and UDQ is constituted by 64 mats (blocks). Each mat has a configuration of 1K-bits ×512 words. Accordingly, each of the memory regions LDQ and UDQ has a configuration of 8K-bits×4K words as shown in FIG. 1.

A region B constituted by eight mats at the right end of the memory region LDQ is shown in an enlarged manner. Each of eight mats along the Y direction is formed of 64 pages of memory cell arrays along the X direction. Among these eight mats, the top and second mats are allocated to DQ0 and DQ1. Similarly, the third and fourth mats are allocated to DQ2 and DQ3, the fifth and sixth mats are allocated to DQ4 and DQ5, and the seventh and eighth mats are allocated to DQ6 and DQ7. When an address bit for designating mats is "0", nth (n is an odd number, that is, 1, 3, 5, and 7) mats are selected. When an address bit for designating mats is "1", nth (n is an even number, that is, 2, 4, 6, and 8) mats are selected.

As shown in FIG. 1, 16 write control circuits WC0 to WC15 are arranged at the lower end of the eight mats along the Y direction. These write control circuits WC0 to WC15 control a timing of a data write operation performed by a write amplifier (described later).

One write control circuit WC is shared by four pages of memory cell arrays per I/O. A part indicated by reference character C in FIG. 1 is one page of memory cell arrays. As the memory region LDQ corresponds to lower 8 bits of I/Os (DQ0 to DQ7) as described above, one write control circuit WC is shared by 32 pages (=4 pages×8 I/Os) of memory cell arrays. The "page" refers to as a memory cell group allocated to the same column address as described above.

Figure 2:
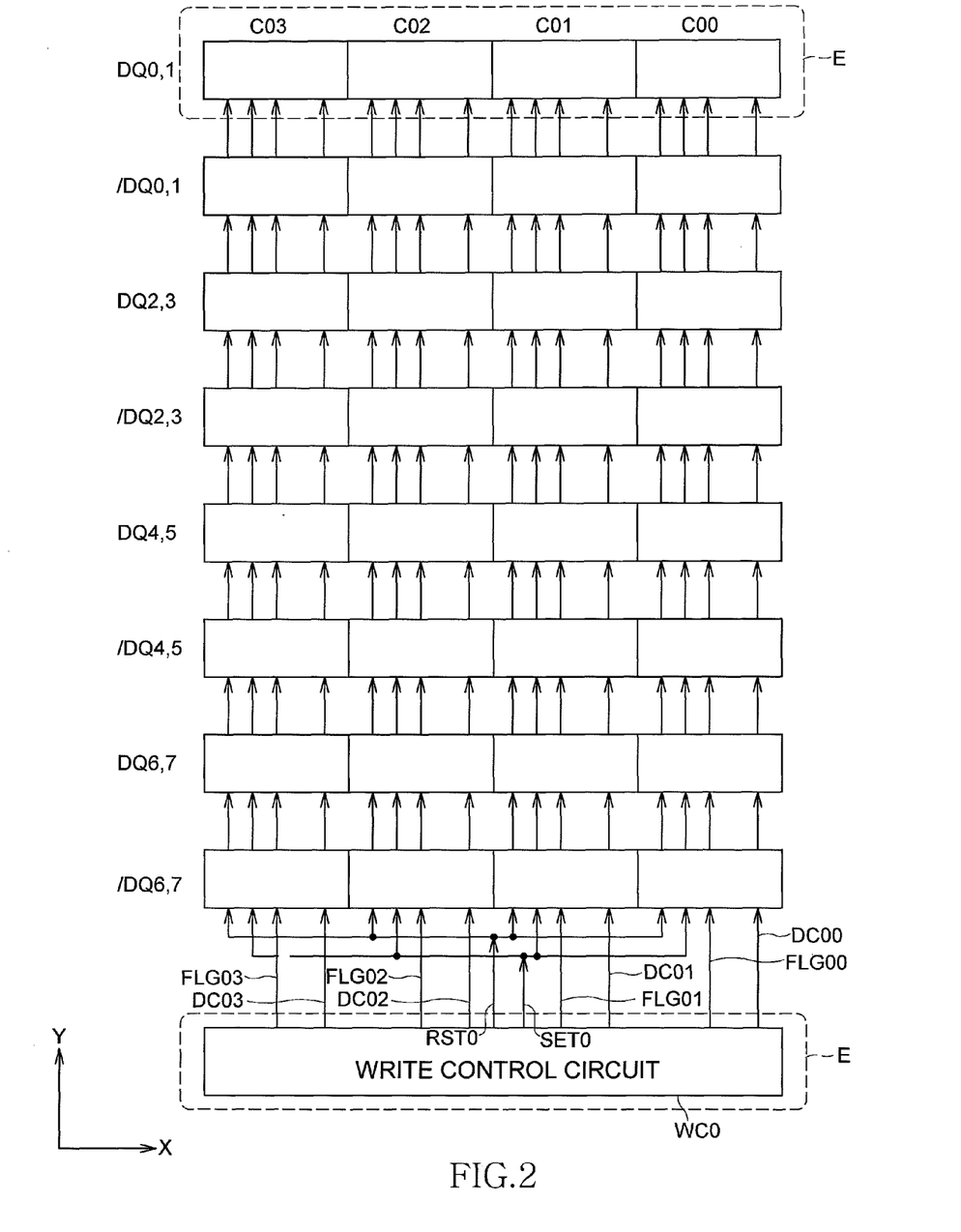
FIG. 2 is an enlarged diagram showing a part indicated by reference character D in FIG. 1.

FIG. 2 is a block diagram showing a part indicated by reference character D in FIG. 1, that is, one write control circuit WC0 and 32 pages of memory cell arrays sharing the write control circuit WC0.

As shown in FIG. 2, the memory cell arrays sharing the write control circuit WC0 are constituted by four rows in the X direction and eight columns in the Y direction, that is, 32 (=4×8) pages of memory cell arrays in total. Eight pages along the Y direction are designated by a same page address and page addresses C00, C01, C02, and C03 are allocated in this order from the right side of FIG. 2. A circuit part to which the same page address is allocated (a circuit part formed of a plurality of memory cells and a plurality of write amplifiers to be described later) is also referred to as "memory cell array part" in the present invention.

The write control circuit WC0 supplies a set pulse SET0 and a reset pulse RST0 constituting a write signal and flag signals FLG00 to FLG03 and data fetch signals DC00 to DC03 corresponding to the page addresses C00 to C03 to 32 pages of memory cell arrays. The set pulse SET0 and the reset pulse RST0 are supplied commonly to all 32 pages. The flag signals FLG00 to FLG03 and the data fetch signal DC00 to DC03 are supplied commonly to units of eight memory cell arrays to which the corresponding page addresses C00 to C03 are allocated.

The set pulse SET0 is a signal for designating a period during which a set current is supplied to memory cells. A selected write amplifier thus supplies the set current to the memory cell during a period when the set pulse SET0 is active, so that the corresponding memory cell becomes a set state (a low resistance state). That is, the time the set current is applied during setting is determined by the set pulse SET0. On the other hand, the reset pulse RST0 is a signal for designating a period during which a reset current is supplied to memory cells. The selected write amplifier thus supplies the reset current to the memory cell during a period when the reset pulse RST0 is active, so that the corresponding memory cell becomes a reset state (a high resistance state). That is, the time the reset current is applied during reset is determined by the reset pulse RST0.

Figure 3:
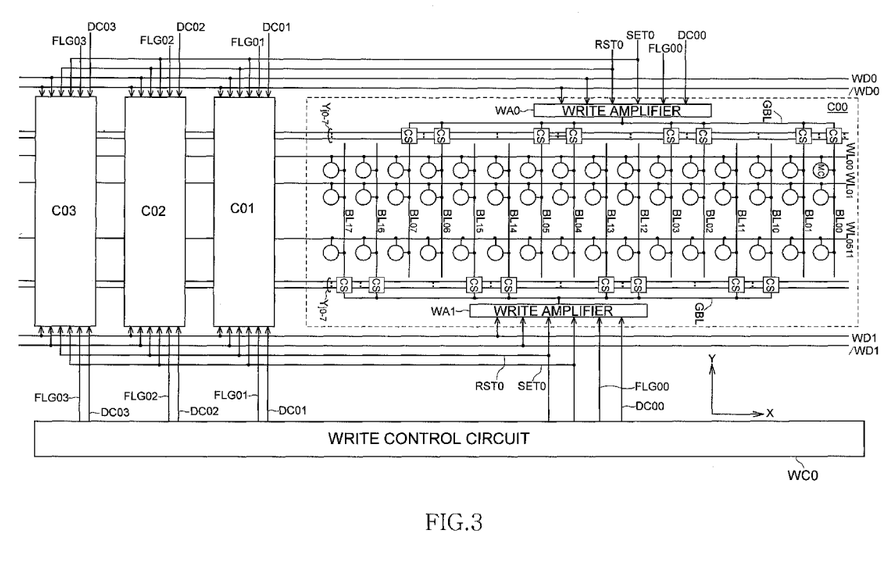
FIG. 3 is an enlarged diagram showing a part indicated by reference character E in FIG. 2.

FIG. 3 is an enlarged diagram of parts indicated by reference character E in FIG. 2, that is, the write control circuit WC0 and four pages of memory cell arrays at the top in FIG. 2.

As shown in FIG. 3, each memory cell array includes 512 word lines WL extending in the X direction, 16 bit lines BL extending in the Y direction, and memory cells MC arranged at intersections of the word lines with the bit lines. One of the word lines WL ($WL_{00}$ to $WL_{0511}$) is selected by a word driver (not shown). The bit line BL is constituted by a bit line $BL_{0i}$ allocated to DQ0 and a bit line $BL_{0i}$ allocated to DQ1 (i=0 to 7). The bit line $BL_{0i}$ is connected via a column switch CS to a write amplifier WA0 placed upward in the Y direction. On the other hand, the bit line $BL_{1i}$ is connected via the column switch CS to a write amplifier WA1 placed downward in the Y direction. The write amplifiers WA0 and WA1 are circuits that supply a write current to the memory cells MC during a period when the write signal (set pulse SET0 and reset pulse RST0) and the corresponding flag signal FLG00, FLG01, FLG02, or FLG03 are active for selected memory cells of the memory cells MC, thereby performing a data write operation.

Complementary write data WD0, /WD0 for DQ0 are supplied to the write amplifier WA0. The write data of DQ0 are written by the write amplifier WA0 in the memory cells connected to the bit line $BL_{0i}$. Similarly, complementary write data WD1, /WD1 for DQ1 are supplied to the write amplifier WA1. The write data of DQ1 are thus written by the write amplifier WA1 in the memory cells connected to the bit line $BL_{1i}$. A write amplifier between two memory cell arrays along the Y direction (write amplifier WA1 in FIG. 3) can be shared by the two memory cell arrays.

As shown in FIG. 3, in addition to the above write data, the set pulse SET0 and the reset pulse RST0 constituting the write signal, the flag signal FLG00, and the data fetch signal DC00 are supplied to the write amplifiers WA0 and WA1 in the memory cell array to which the page address C00 is allocated. Although not shown, in addition to the set pulse SET0 and the reset pulse RST0, the corresponding flag signals FLG01 to FLG03 and data fetch signals DC01 to DC03 are supplied to the write amplifiers in the memory cell arrays to which the page addresses C01 to C03 are allocated, respectively.

Figure 4:
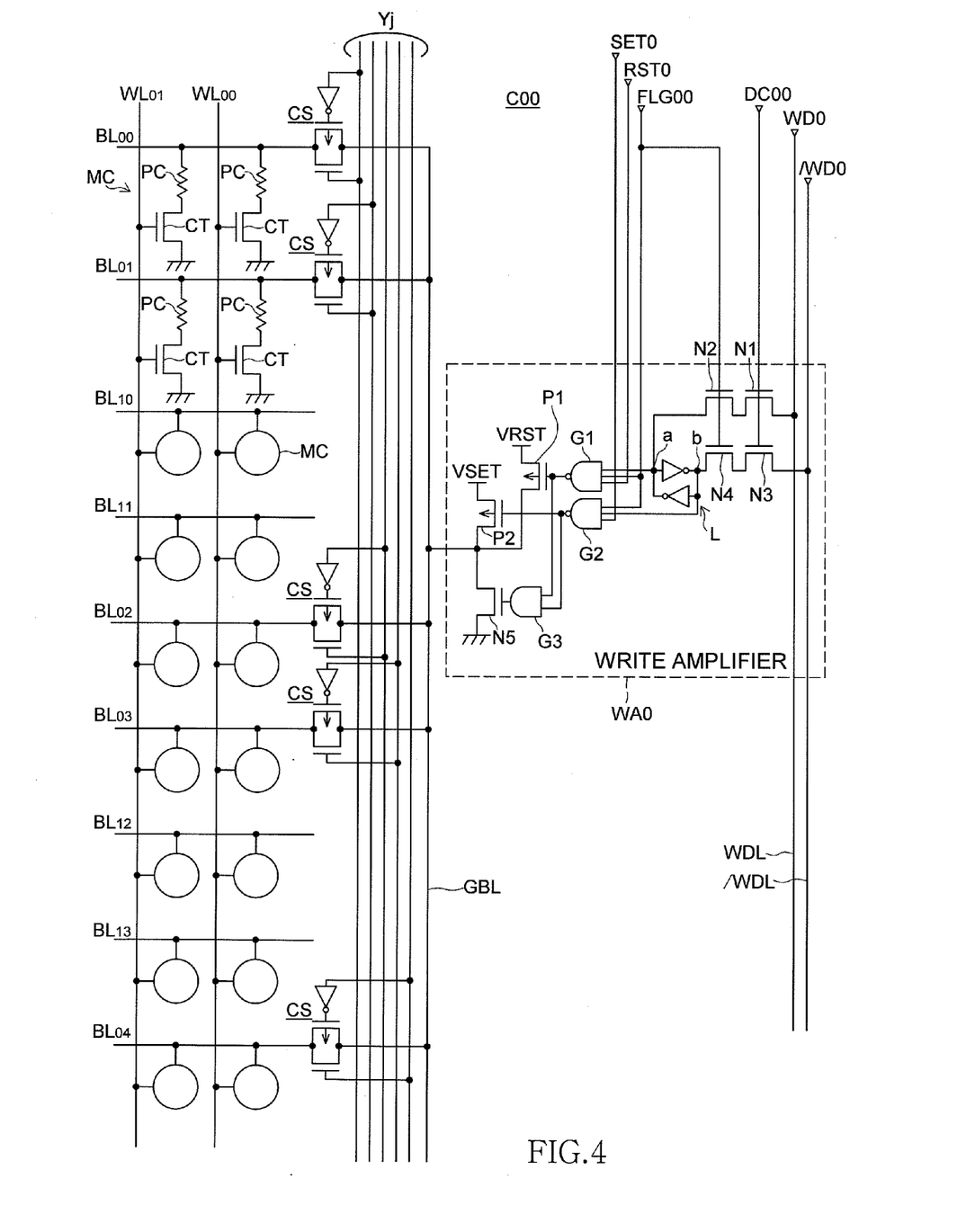
FIG. 4 shows a circuit configuration of a part of the memory cell array to which the page address C00 is allocated and the write amplifier WA0.

FIG. 4 shows a circuit configuration of a part of the memory cell array to which the page address C00 is allocated and the write amplifier WA0.

As shown in FIG. 4, the bit line $BL_{0i}$ allocated to DQ0 is connected via the column switch CS and a global bit line GBL to the write amplifier WA0. The column switch CS connects any one bit line $BL_{0i}$ to the global bit line GBL and its selection depends on a column select signal Yj. The column select signal Yj is an internal signal generated by a partial column address.

The memory cell MC is formed of a phase change memory element PC and a cell transistor CT serially connected to each other between the bit line BL and a source potential VSS. A gate electrode of the cell transistor CT is connected to the corresponding word line WL. When a predetermined word line WL is activated, the phase change memory element PC is connected between the bit line BL and the source potential VSS.

Although the phase change material constituting the phase change memory element PC is not limited especially as long as it can take two or more phase states and its electric resistance varies depending on the phase state, a so-called chalcogenide material is preferably selected. The chalcogenide material is an alloy containing at least one of germanium (Ge), antimony (Sb), tellurium (Te), indium (In), and selenium (Se). Examples of the chalcogenide material include binary elements including GaSb, InSb, InSe, $Sb_2Te_3$, and GeTe, ternary elements including $Ge_2Sb_2Te_5$, InSbTe, GaSeTe, $SnSb_2Te_4$, and InSbGe, and quaternary elements including AgInSbTe, (GeSn)SbTe, GeSb(SeTe), and $Te_{81}Ge_{15}Sb_2S_2$.

The phase change material including the chalcogenide material can be either in an amorphous phase (a non-crystalline phase) or in a crystalline phase. In the amorphous phase, a relatively high resistance state is provided. In the crystalline phase, a relatively low resistance state is provided.

To amorphize (reset) the phase change material, a write current needs to be applied to heat the phase change material to temperatures higher than a melting point and then cool the material rapidly. The time the reset current required is applied is determined by the reset pulse RST0 as described above. Meanwhile, to crystallize (set) the phase change material, the write current needs to be applied to heat the phase change material to temperatures higher than a crystallization temperature and lower than the melting point and cool the material gradually. The time the set current required is applied is determined by the set pulse SET0 as described above.

The write amplifier WA0 includes two N-channel MOS transistors N1 and N2 connected serially between the write data line WDL0 and an input/output node a of a latch circuit L and two N-channel MOS transistors N3 and N4 connected serially between the write data line /WDL0 and an input/output node b of the latch circuit L. Write data WD0 and /WD0 are supplied to the write data lines WDL0 and /WDL0, respectively. The data fetch signal DC00 is supplied commonly to gate electrodes of the transistors N1 and N3. The flag signal FLG00 is supplied commonly to gate electrodes of the transistors N2 and N4. Such a configuration allows the write data WD0 and /WD0 supplied through the write data lines WDL0 and /WDL0 to be fetched in the latch circuit L when the data fetch signal DC00 and the flag signal FLG00 are activated to a high level. The input/output nodes a and b of the latch circuit L are connected to input terminals of NAND gates G1 and G2, respectively.

The NAND gate G1 is a three-input circuit and the reset pulse RST0 and the flag signal FLG00 are also inputted thereto. Accordingly, when a logical level of write data latched in the latch circuit L is "1" and the reset pulse RST0 and the flag signal FLG00 are a high level, an output of the NAND gate G1 is a low level. A reset transistor P1 including a P-channel MOS transistor is thus turned on. As shown in FIG. 4, a source of the reset transistor P1 is connected to a reset potential VRST and a drain thereof is connected to the global bit line GBL.

The NAND gate G2 is also a three-input circuit and the set pulse SET0 and the flag signal FLG00 are inputted thereto. Accordingly, when the logical level of the write data latched in the latch circuit L is "0" and the set pulse SET0 and the flag signal FLG00 are a high level, an output of the NAND gate G2 is a low level. A set transistor P2 including a P-channel MOS transistor is thus turned on. As shown in FIG. 4, a source of the set transistor P2 is connected to a set potential VSET and a drain thereof is connected to the global bit line GBL.

The reset potential VRST is required for causing the phase change memory element PC included in the memory cell MC to be in the amorphous state. The set potential VSET is required for causing the phase change memory element PC included in the memory cell MC to be in the crystalline state. Because more Joule heat is required for amorphizing the phase change memory element PC as compared to crystallization, it is preferable to set to VRST>VSET.

Further, the write amplifier WA0 further includes an AND gate G3 that receives the outputs of the NAND gates G1 and G2. An output of the AND gate G3 is supplied to a gate electrode of an N-channel MOS transistor N5 connected between the global bit line GBL and a ground potential. Under a condition that either the reset transistor P1 or the set transistor P2 is turned on, the transistor N5 is turned off. Under a condition that both the reset transistor P1 and the set transistor P2 are turned off, the transistor N5 is turned on. When the transistor N5 is turned on, the global bit line GBL is fixed at the ground potential.

Figure 5:
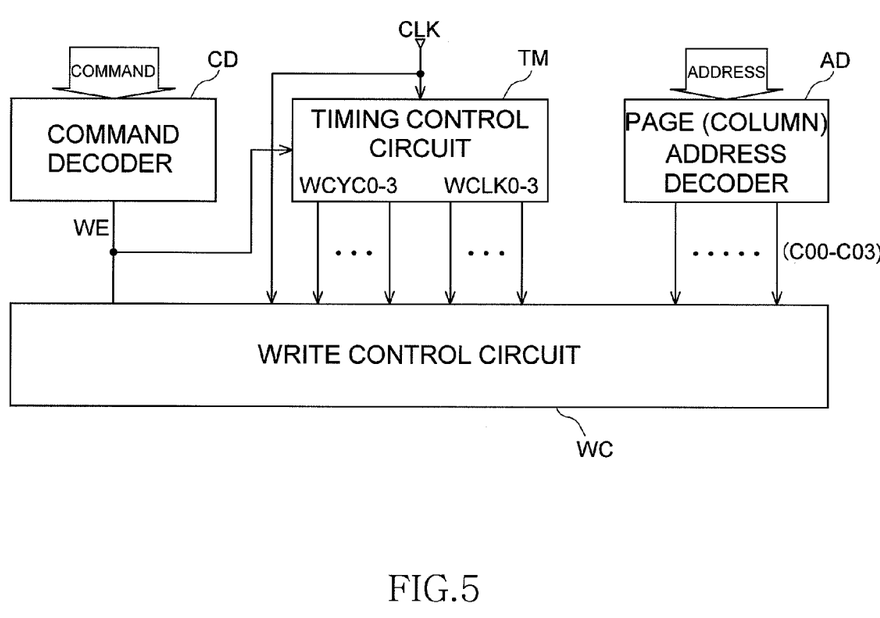
FIG. 5 shows signals supplied commonly to the write control circuit WC.

FIG. 5 shows signals supplied commonly to the write control circuit WC.

As shown in FIG. 5, a write signal WE, an internal clock signal CLK, write cycle signals WCYC0 to WCYC3, write clock signals WCLK0 to WCLK3, and the page addresses C00 to C03 are supplied to the write control circuit WC.

The write signal WE is generated by a command decoder CD. The command decoder CD is a circuit that receives externally supplied commands, decodes them, and generates various internal commands based on the results. The write signal WE is one of the internal commands generated by the command decoder CD and becomes active when the externally supplied command is a write command.

The internal clock signal CLK controls operation timings of the various control circuits constituting the semiconductor memory device according to the present embodiment and is generated within the semiconductor memory device in response to an externally supplied external clock.

The write cycle signals WCYC0 to WCYC3 and the write clock signals WCLK0 to WCLK3 are generated by a timing control circuit TM. The timing control circuit TM generates the write cycle signals WCYC0 to WCYC3 and the write clock signals WCLK0 to WCLK3 in synchronization with the internal clock signal CLK at the time of activation of the write signal WE. Waveforms of the write cycle signals WCYC0 to WCYC3 and the write clock signals WCLK0 to WCLK3 are described later.

The page addresses C00 to C03 are signals generated by a page (column) address decoder AD. The page address decoder AD is a circuit that receives a partial column address and decodes it to cause any one bit of the page addresses C00 to C03 to be active.

Figure 6:
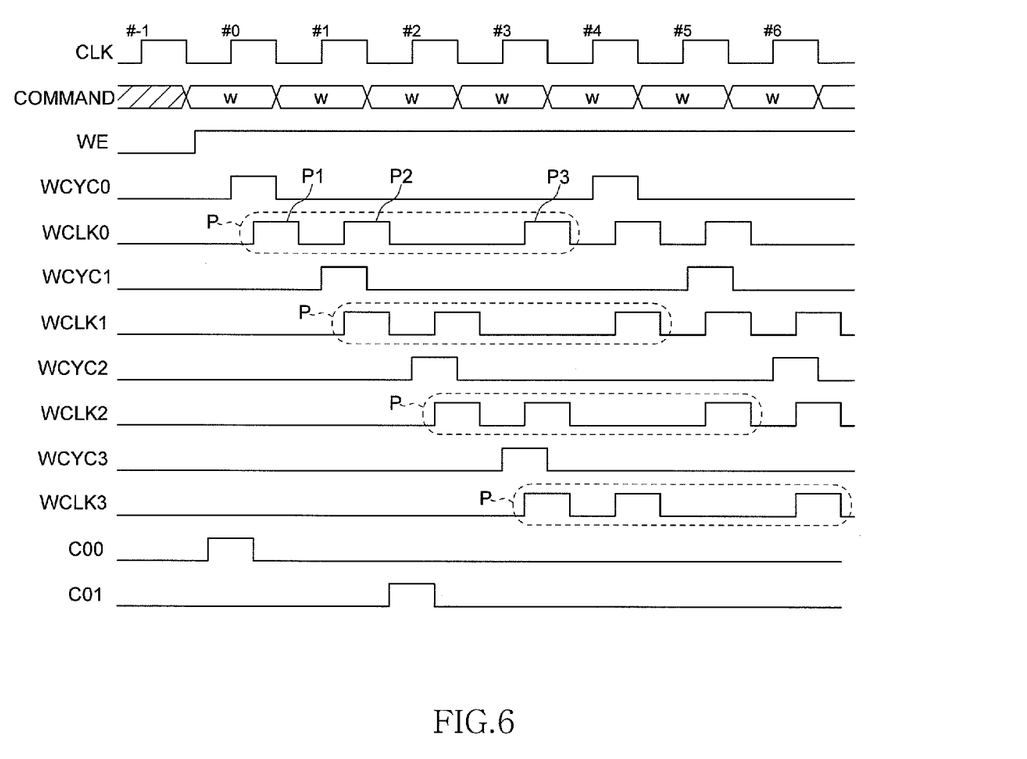
FIG. 6 is a timing chart showing the waveforms of the various signals inputted to the write control circuit WC.

FIG. 6 is a timing chart showing the waveforms of the various signals inputted to the write control circuit WC.

As shown in FIG. 6, the externally supplied write command W can be inputted every clock cycle. When the write command W is issued, the write signal WE is activated to a high level. When the write signal WE is active at an active edge #0 of the internal clock signal CLK, the timing control circuit TM causes the write cycle signal WCYC0 to be active for one clock and activates the write clock signal WCLK0 at a predetermined sequence.

An active sequence of the write clock signal WCLK0 is constituted by three pulses P1 to P3. According to the example of FIG. 6, the active sequence is constituted by a pulse group P including the pulses P1 to P3 in synchronization with the active edges #0, #1, and #3 of the internal clock signal CLK, respectively. Therefore, one pulse group P uses four clock cycles. Accordingly, when the phases of the write clock signals WCLK0 to WCLK3 are shifted from each other by one clock, all active edges of the internal clock signal CLK become start timings of the respective pulse groups P. This means that even when the write commands W are successively issued as shown in FIG. 6, the start timings of the write clock signals WCLK0 to WCLK3 do not overlap.

A period from the pulse P1 to the pulse P3 corresponds to a period for crystalizing (setting) the phase change material which is three clocks in the present embodiment. A period from the pulse P1 to the pulse P2 corresponds to a period for amorphizing (resetting) the phase change material which is one clock in the present embodiment. As described above, although the time required for data write varies depending on data to be written in memory cells in PRAM, the write operation needs to be performed according to a longer time required for data write. Accordingly, in the semiconductor memory device according to the present embodiment, the time required for data write is three clock cycles.

The write cycle signals WCYC0 to WCYC3 have one-shot pulse waveforms, respectively, prior to start of pulse groups P of the write clock signals WCLK0 to WCLK3. Thus, the phases of the write Cycle signals WCYC0 to WCYC3 are shifted from each other by one clock. When the write commands W are successively issued as shown in FIG. 6, the write cycle signal is activated every four clocks.

The page addresses C00 and C01 are made to be active in synchronization with the active edges #0 and #2 of the internal clock signal CLK in the example shown in FIG. 6. This means that the column address indicating the page address C00 is inputted along with the write command W with the active edge #0 and the column address indicating the page address C01 is inputted along with the write command W with the active edge #2.

Figure 7:
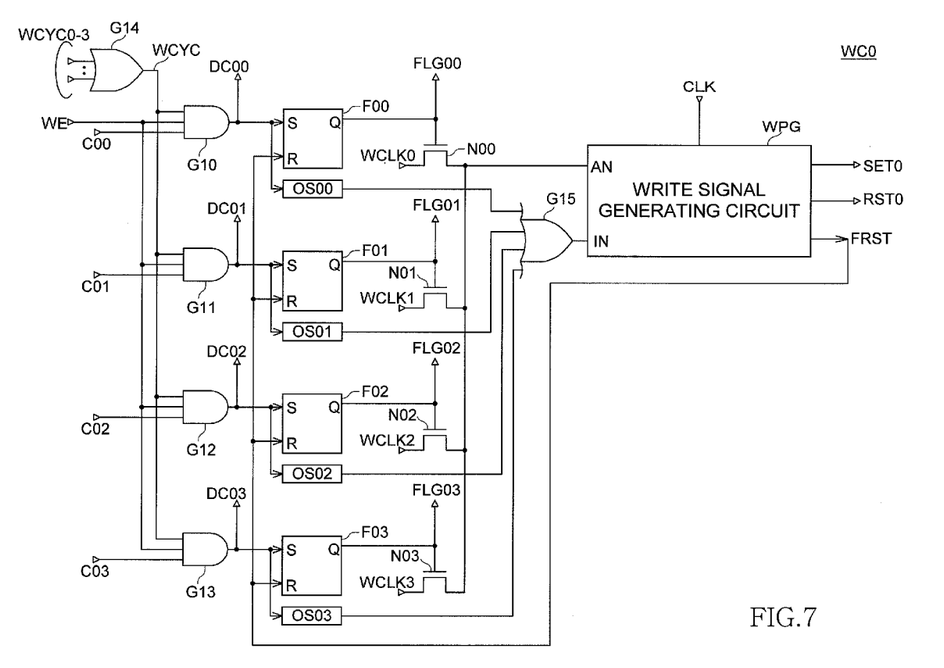
FIG. 7 is a circuit diagram of the write control circuit WC0.

FIG. 7 is a circuit diagram of the write control circuit WC0.

As shown in FIG. 7, the write control circuit WC0 has AND gates G10 to G13 that receives the page addresses C00 to C03, respectively. The AND gates G10 to G13 are three-input circuits and the write signal WE and the write cycle signal WCYC are supplied commonly to two remaining input terminals. The write cycle signal WCYC is an OR output of an OR gate G14 that receives the write cycle signals WCYC0 to WCYC3.

Outputs of the AND gates G10 to G13 are outputted to outside the write control circuit WC0 as the data fetch signals DC00 to DC03, and supplied to set input terminals (S) of flags F00 to F03. The flags F00 to F03 are SR (set-reset) flip-flop circuits. Accordingly, when the flags are set once, their set states are maintained until a flag reset signal FRST is supplied to the respective reset input terminals (R). Signals outputted from output terminals (Q) of the flags F00 to F03 are outputted to outside the write control circuit WC0 as the flag signals FLG00 to FLG03, respectively.

The write control circuit WC0 also includes N-channel MOS transistors N00 to N03 that receive the flag signals FLG00 to FLG03 at their gate electrodes. The write clock signals WCLK0 to WCLK3 are supplied to drains of the transistors N00 to N03. Sources of the transistors N00 to N03 are wired-or-connected to an active node AN of a write signal generating circuit WPG.

The write signal generating circuit WPG causes the set pulse SET0 and the reset pulse RST0 to be active at a predetermined sequence based on the waveforms of the write clock signals WCLK0 to WCLK3 inputted to the active node AN. A specific active sequence of the set pulse SET0 and the reset pulse RST0 is described later.

The write signal generating circuit WPG includes, in addition to the active node AN, an initialize node IN. The initialize node IN initializes the write signal generating circuit WPG. Accordingly, when an input signal to the initialize node IN becomes active while the active sequence of the set pulse SET0 and the reset pulse RST0 is performed, the currently performed active sequence is suspended and a new active sequence is restarted.

The input signal to the initialize node IN is an OR output of the one-shot circuits OS00 to OS03 that generate one-shot pulses from the outputs of the AND gates G10 to G13. The OR of the one-shot circuits OS00 to OS03 is generated by an OR gate G15. This means that each time when the flags F00 to F03 are set, the write signal generating circuit WPG is forcibly initialized. That is, even when a flag is set and the active sequence of the set pulse SET0 and the reset pulse RST0 starts based on the flag, when another flag is set, the currently performed active sequence is suspended and a new active sequence then restarts.

When the series of the active sequence is completed without other flags being set during the sequence, the write signal generating circuit WPG causes the flag reset signal FRST to be active. The flag reset signal FRST is supplied commonly to the reset input terminals (R) of the flags F00 to F03. Therefore, when the active sequence is completed without other flags being set during the sequence, all of the flags F00 to F03 are reset.

Figure 8:
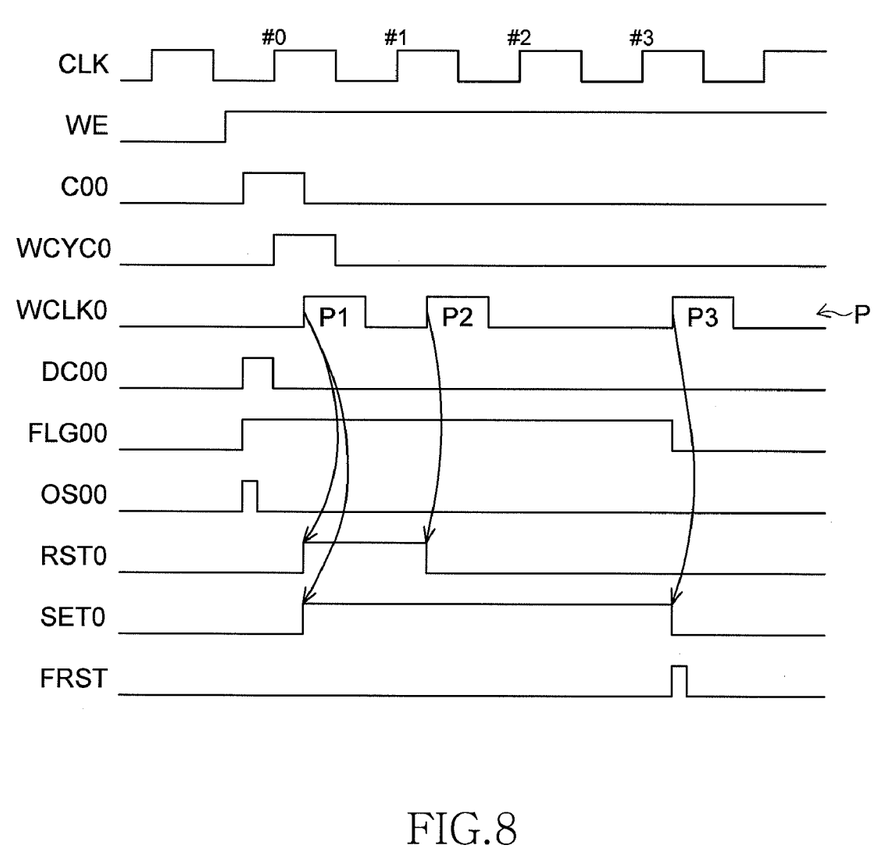
FIG. 8 is a timing chart for explaining an operation of the write control circuit WC0.

FIG. 8 is a timing chart for explaining an operation of the write control circuit WC0. FIG. 8 shows an example in which the page address C00 is designated and the write clock signal WCLK0 and the write cycle signal WCYC0 are activated.

As shown in FIG. 8, when the write signal WE and the page address C00 are activated to a high level, the data fetch signal DC00 is activated in synchronization with the write cycle signal WCYC0. Therefore, the flag F00 is set, the flag signal FLG00 becomes a high level, and the write signal generating circuit WPG is initialized. When the flag signal FLG00 becomes a high level, the write clock signal WCLK0 is supplied to the active node AN of the write signal generating circuit WPG.

The write clock signal WCLK0 has the pulse group P constituted by the pulses P1 to P3 in synchronization with the active edges #0, #1, and #3 of the internal clock signal CLK, respectively. In response to the pulse group P, the write signal generating circuit WPG activates the reset pulse RST0 to a high level between the rising edges of the pulses P1 and P2 and the set pulse SET0 to a high level between the rising edges of the pulses P1 to P3. An active sequence of the write signal formed of the reset pulse RST0 which is active only for one clock cycle and the set pulse SET0 which is active for three clock cycles is performed.

When the above active sequence is completed, the flag reset signal FRST becomes active and the flag F00 is reset. The flag signal FLG00 thus returns to inactive (low level).

The operation described above represents a case that other flags are not set during performing the active sequence. An operation when other flags are set during performing the active sequence is described next.

Figure 9:
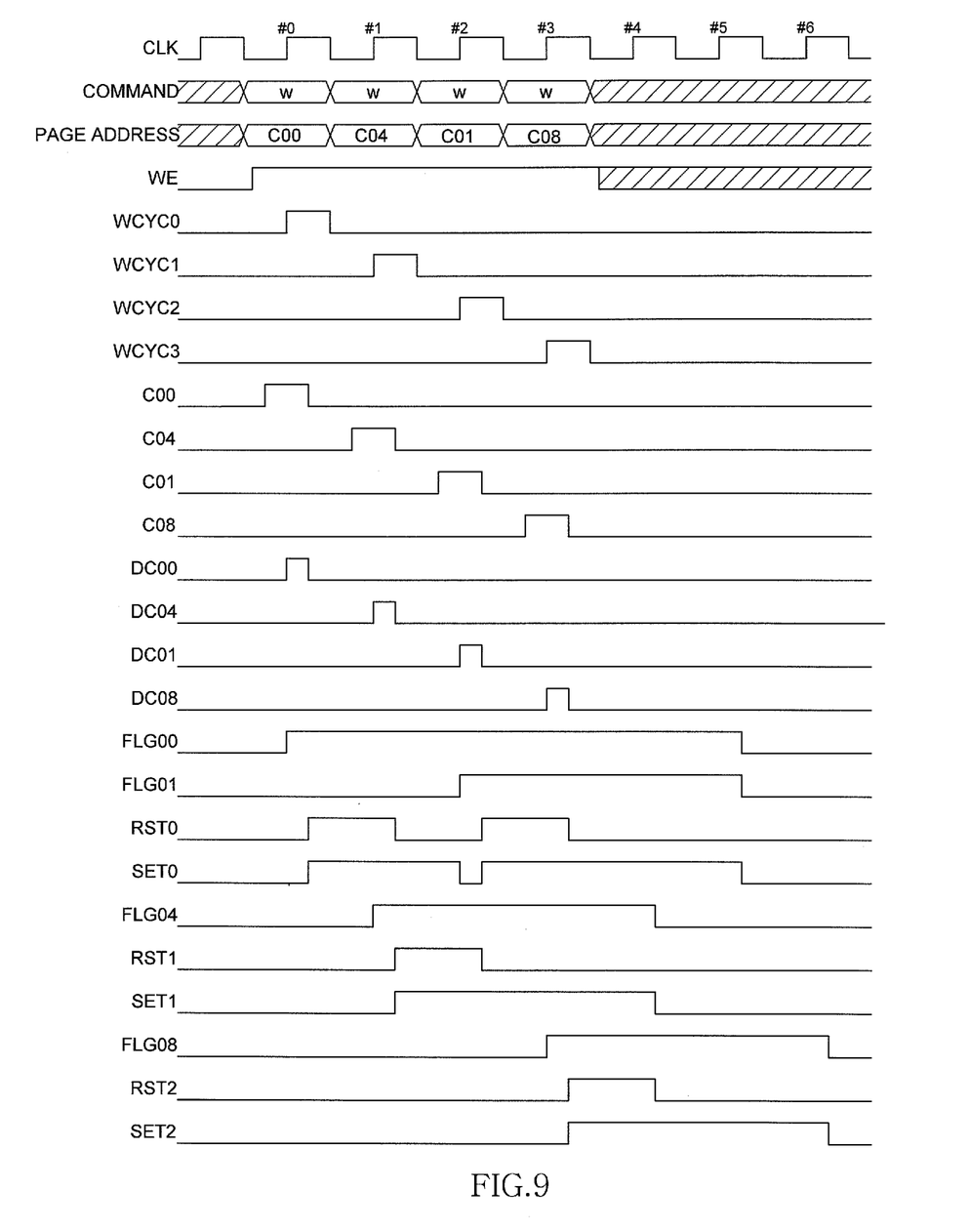
FIG. 9 is another timing chart for explaining an operation of the write control circuit WC0.

FIG. 9 is another timing chart for explaining an operation of the write control circuit WC0 and shows a case that write commands W designating the page addresses C00, C04, C01, and C08 are issued in synchronization with the active edges #0 to #3 of the internal clock signal CLK, respectively. As the same write control circuit WC0 is allocated to the page addresses C00 and C01, the flag corresponding to the page address C01 is set while the active sequence of the page address C00 is performed. Detailed descriptions of this operation are given below.

As shown in FIG. 9, when the write commands W are consecutively issued in synchronization with the active edges #0 to #3 of the internal clock signal CLK, the write cycle signal WCYC0 to WCYC3 are successively activated in synchronization with the respective active edges #0 to #3. Further, the designated page addresses C00, C04, C01, and C08 are successively activated in synchronization with the write cycle signals and thus the data fetch signals DC00, DC04, DC01, and DC08 are also activated successively.

Regarding the flag, the flag F00 is set first in synchronization with the active edge #0 and the flag F01 is set in synchronization with the active edge #2. While the flag F04 is also set in synchronization with the active edge #1 and the flag F08 is set in synchronization with the active edge #3, these flags do not interfere with each other because they are provided in write control circuits (WC1 and WC2) different from the write control circuit WC0.

When the flag F00 in the write control circuit WC0 is set, the write signal generating circuit WPG performs the active sequence. While three clock cycles (=time required for data write) are required for completing the active sequence as described above, the flag F01 is set after two clock cycles since the active sequence for the flag F00 starts to be performed in the example of FIG. 9. As a result, the write signal generating circuit WPG causes the write signal to be temporarily inactive to suspend the currently performed active sequence and then causes the write signal to be active in synchronization with the active edge #2 to restart the active sequence.

The restarted active sequence is performed with both of the flags F00 and F01 being set. That is, the flag signals FLG00 and FLG01 are active when the restarted active sequence is performed. Therefore, during the restarted active sequence, the suspended data write operation upon the page address C00 and a new data write operation upon the page address C01 are performed simultaneously. The restarted active sequence is then completed in synchronization with the active edge #5.

The data write operation upon the page address C01 is in response to the final data write request made by utilizing the write control circuit WC0. Therefore, in response to the final data write request, a plurality of data write operations are performed by a plurality of the write amplifiers simultaneously.

The data write operation upon the page address C04 is performed by the active sequence of the set pulse SET1 and the reset pulse RST1 in response to setting of the flag F04 and completed in synchronization with the active edge #4. Similarly, the data write operation upon the page address C08 is performed by the active sequence of the set pulse SET2 and the reset pulse RST2 in response to setting of the flag F08 and completed in synchronization with the active edge #6. Because these operations are performed by the write control circuits (WC1 and WC2) different from the write control circuit WC0 as described above, interferences do not occur.

As described above, according to the semiconductor memory device. of the present embodiment, the data write operation is performed regardless of the existence of successive write requests. When a write request using a write amplifier sharing the same write control circuit is issued, the data write operation for the previous write request is performed again. Accordingly, random column access as that in a DRAM can be realized.

It is apparent that the present invention is not limited to the above embodiments, but may be modified and changed without departing from the scope and spirit of the invention.

For example, while the above embodiment has explained a case that the semiconductor memory device according to the present invention is a PRAM, the invention is not limited thereto. The present invention can be also applied to other semiconductor memories as long as they have memory cells with a relatively long time required for data write.

What is claimed is:

1. A semiconductor device comprising:
a plurality of memory cell arrays, each of which includes a plurality of memory cells and a write amplifier that performs a data write operation upon a selected one of the memory cells in response to an active state of a write signal; and
a write control circuit that supplies the write signal in common to the memory cell arrays and includes a plurality of flags provided respectively for the memory cell arrays, each of the flags being brought into a set state when an associated one of the memory cell arrays is subject to the data write operation,
the write control circuit bringing the write signal from the active state to an inactive state in response to a new data write request which is issued for a first one of the memory cell arrays during the data write operation being performed upon a second one of the memory cell arrays, and then bringing the write signal from the inactive level to the active level again to perform the data write operation upon the first and second ones of the memory cell arrays in response to the new data write request and to the set state of one of the flags which corresponds to the second one of the memory cell arrays.

2. The device as claimed in claim 1, wherein the write control circuit performs the data write operation upon the first and second ones of the memory cell arrays simultaneously with each other.

3. The device as claimed in claim 1, wherein the write control circuit resets each of the flags after the data write operation upon an associated one of the memory cell arrays is completed.

4. The semiconductor memory device as claimed in claim 1, wherein plural ones of the memory cells of each of the memory cell arrays are selected by a common column address.

5. The device as claimed in claim 1, wherein each of the memory cells comprises a phase change material.

6. The device as claimed in claim 5, wherein the write amplifier is configured to supply a write current to the selected one of the memory cells, and the write signal is configured to determine a period of time during which the write current is supplied to the selected one of the memory cells.

7. The device as claimed in claim 6, wherein the write signal includes a set pulse for crystallizing the phase change material and a reset pulse for amorphizing the phase change material.

8. A semiconductor device comprising:
a plurality of memory cells;
a plurality of write amplifiers performing data write operations respectively upon selected ones of the memory cells; and
a write control circuit that controls timings of the data write operations performed by the write amplifiers, the write control circuit being configured to cause, when successive requests of the data write operations performed by different ones of the write amplifiers are made, the different ones of the write amplifiers to perform the data write operations simultaneously with each other in response to a last one of the successive requests.

9. The device as claimed in claim 8, wherein the successive requests occurs before the data write operation based on a preceding one of the successive requests is completed.

10. The semiconductor memory device as claimed in claim 9, wherein each of the memory cells is dependent on a value of data to be written in period of time needed to write data thereinto.

11. The semiconductor memory device as claimed in claim 10, each of the memory cells includes a phase change material, and the write amplifier is configured to supply a set current or a reset current to the selected memory cell in response to the value of data to be written.

12. A semiconductor device comprising:
a plurality of write control circuits each allocated to a plurality of pages, and
a plurality of write amplifiers provided for each of the write control circuits to write data in corresponding memory cells, wherein
each of the write control circuits supplies a write signal with a predetermined active sequence commonly to corresponding write amplifiers and flag signals to the write amplifiers allocated to different pages,
each of the write amplifiers supplies a write current to memory cells during a period when the write signal and the flag signal are in an active state, and
when a plurality of data write operations using the plurality of write amplifiers allocated to a same write control circuit but in different pages are requested successively, the write control circuit brings the corresponding flag signal to the active state and restarts the active sequence of the write signal each time a new data write operation is requested, and in response to completion of the active sequence of the write signal, the write control circuit brings all of the flag signals to the inactive state.

* * * * *